United States Patent [19]

Tanaka

[11] Patent Number: 4,958,208
[45] Date of Patent: Sep. 18, 1990

[54] BIPOLAR TRANSISTOR WITH ABRUPT POTENTIAL DISCONTINUITY IN COLLECTOR REGION

[75] Inventor: Shin-Ichi Tanaka, Tokyo, Japan

[73] Assignee: NEC Corporation, Japan

[21] Appl. No.: 230,592

[22] Filed: Aug. 8, 1988

[30] Foreign Application Priority Data

| Aug. 12, 1987 | [JP] | Japan | 62-202107 |
| Aug. 31, 1987 | [JP] | Japan | 62-218820 |
| Dec. 4, 1987 | [JP] | Japan | 62-308147 |

[51] Int. Cl.$^5$ .................................... H01L 29/72
[52] U.S. Cl. ............................ 357/34; 357/16; 357/90; 357/58
[58] Field of Search ............ 357/34, 34 HB, 16, 58, 357/90

[56] References Cited

U.S. PATENT DOCUMENTS 4,712,121 12/1987 Yokoyama .................... 357/34 X

FOREIGN PATENT DOCUMENTS

| 0070211 | 1/1983 | European Pat. Off. ...... 357/34 HB |
| 61-53769 | 3/1986 | Japan ............................ 357/34 HB |
| 62-229878 | 10/1987 | Japan ............................ 357/34 HB |
| 63-289860 | 11/1988 | Japan ............................ 357/34 HB |

OTHER PUBLICATIONS

No author, "Graded Barrier in Tunneling Hot Electron Transfer Amplifiers," *IBM Technical Disclosure Bulletin,* vol. 31, No. 8, Jan. 1989, pp. 345–346.

*Primary Examiner*—William Mintel
*Attorney, Agent, or Firm*—Laff, Whitesel, Conte & Saret

[57] ABSTRACT

There is disclosed a heterojunction bipolar transistor comprising an emitter region having a first conductivity type, a base region having a second conductivity type opposite to the first conductivity type, and a collector region having a graded collector section formed of a first compound semiconductor material and a collector contact section formed of a second compound semiconductor material of the first conductivity type, and an emitter-base junction, a base-collector junction and an abrupt potential discontinuity are formed between the emitter region and the base region, between the base region and the graded collector section and between the graded collector section and the collector contact section, respectively, wherein the first compound semiconductor material is increased in bandgap from the base-collector junction toward the collector contact section and the second semiconductor material is smaller in bandgap at the abrupt junction than the first semiconductor material, so that the potential difference between the base region and the collector region is compensated by the abrupt potential discontinuity, thereby restricting the production of hot electrons.

28 Claims, 10 Drawing Sheets

PRIOR-ART

PRIOR-ART

PRIOR-ART

PRIOR-ART

BIPOLAR TRANSISTOR WITH ABRUPT POTENTIAL DISCONTINUITY IN COLLECTOR REGION

FIELD OF THE INVENTION

This invention relates to a bipolar transistor and, more particularly, to the structure of a collector region of the bipolar transistor.

BACKGROUND OF THE INVENTION

Particular attention is being paid to a heterojunction bipolar transistor using compound semiconductor materials such as gallium arsenide and aluminum gallium arsenide because this attractive candidate for the next generation can provide a large current driving capability and a high frequency performance. In general, the switching speed of the heterojunction bipolar transistor is roughly dominated by three factors i.e., the accumulation time of the parasitic capacitance, the base transit time of minority carriers and the transit time across the depletion layer projecting from the base-collector junction into both base and collector regions, and each of the three factors occupies about one third of the total delay. Recent research and development efforts result in reduction of the parasitic capacitance and the parasitic resistance as well as reduction of the base transit time, but the third factor still remains unsolved.

In FIG. 1 of the drawings, there is shown a typical example of the energy band diagram produced in a heterojunction bipolar transistor which largely comprises an emitter region of an n-type aluminum gallium arsenide represented by the molecular formula of $Al_{0.3}Ga_{0.7}As$, a base region of a p-type aluminum gallium arsenide represented by the molecular formula of $Al_xGa_{1-x}As$ where x ranges between 0.1 and 0.0, and a collector region consists of a base junction section of a lightly doped n-type gallium arsenide ($n^-GaAs$) and a collector contact section of a heavily doped n-type gallium arsenide ($n^+GaAs$). In the energy band diagram, the lower edge of the conduction band, the Fermi level and the upper edge of the valence band are abbreviated as Ec, Ef and Ev, respectively. The base junction section of the collector region is small in impurity concentration, so that a depletion layer deeply penetrates into the collector region. A strong electric field takes place across the depletion layer due to difference in potential between the base region and the collector region, and electrons reaching the depletion layer are subjected to the strong electric field, thereby immediately becoming hot electrons HE. The hot electrons are moved from the Γ-valley 1 to the L-valley 2, and the effective mass of each hot electron becomes large. Since most of the hot electrons are moved to the L-valley 2, the drift mobility is affected by the large effective mass and, for this reason, a large amount of time is consumed to terminate the traveling across the collector region. The transit time across the depletion layer mainly dominates the switching speed of the heterojunction bipolar transistor in the circumstances described above, so that a solution is needed to improve the heterojunction bipolar transistor.

FIG. 2 shows an energy band diagram produced in another heterojunction bipolar transistor comprising an n-type collector region, a p-type base region and an n-type emitter region having a wider bandgap than the base region. In this prior-art heterojunction bipolar transistor, a depletion layer takes place and deeply penetrates into the collector region, and a strong electric field is produced across the depletion layer due to difference 3 in potential between the base region and the collector region. Then, electrons are also subjected to the strong electric field and becomes hot electrons HE. These hot electrons are moved into the L-valley as similar to those in the heterojunction bipolar transistor shown in FIG. 1, so that the drift mobility is decreased.

One of the attempts to reduce the transit time across the depletion layer is to absorb the potential difference between the base region and the collector region by using a p-n junction formed by a heavily doped p-type region and a heavily doped n-type region. FIG. 3 shows an energy band diagram produced in a heterojunction bipolar transistor of the type having a p-n junction formed by a heavily doped p-type region and a heavily doped n-type region. The heterojunction bipolar transistor comprises an emitter region of an n-type aluminum gallium arsenide represented by the molecular formula of $Al_{0.3}Ga_{0.7}As$, a base region of a $p^+$type aluminum gallium arsenide represented by the molecular formula of $Al_xGa_{1-x}As$ where x ranges between 0.1 to 0.0, and a collector region consisting of three sections. The collector region is provided with the three sections respectively formed of an intrinsic gallium arsenide (i-GaAs), a heavily doped $p^+$type gallium arsenide and a heavily doped $n^+$type gallium arsenide, and the second section of $p+$type gallium arsenide is extremely thin. In this prior-art heterojunction bipolar transistor, a difference in potential between the base region and the collector region is absorbed by the p-n junction formed by the second and third sections, so that a relatively small electric field takes place across the first section of the intrinsic gallium arsenide. For this reason, electrons mostly travel along the Γ-valley without moving into the L-valley over the first section of the intrinsic gallium arsenide corresponding to the depletion layer produced in the collector region shown in FIG. 1. If the electrons travel along the Γ-valley, each electron is small in effective mass, so that a delay is hardly introduced in the transit time across the first section of the intrinsic gallium arsenide.

This solution is also employed for the heterojunction bipolar transistor shown in FIG. 2. An energy band diagram produced in the heterojunction bipolar transistor of the type having a p-n junction formed by heavily doped sections is illustrated in FIG. 4, and most of the potential difference 4 between the base region and the collector region is absorbed by the potential difference 5 formed by the heavily doped sections. However no further description is hereinunder incorporated so as to avoid a repeat.

However, a problem is encountered in the prior-art heterojunction bipolar transistors illustrated in FIGS. 3 and 4 in stability under operation. Namely, each collector has the second and third sections heavily doped with the p-type impurity atoms and the n-type impurity atoms, respectively, so that the p-n junction formed therebetween is liable to be broken down with a relatively small reverse bias voltage. This breakdown results in unstable operation. Moreover, a relatively small potential barrier for holes takes place between the base region and the collector region, so that holes HL in the base region tend to be forwarded to the collector region under a high injected condition as shown in FIG. 3. This also results in unstable operation. Of course, the stability in operation may be controlled by selection of biasing conditions, however this solution is not recommendable because of small biasing tolerance.

Another problem encountered in the prior-art heterojunction bipolar transistors is formation of the second section of the heavily doped p-type gallium arsenide. The second section is extremely thin and heavily doped with beryllium atoms, so that the beryllium atoms tend to diffuse from the thin second section during high temperature processes after the doping step. If the beryllium atoms are diffused from the thin second section, the second section is decreased in impurity atom concentration. The high speed operation is realized in so far as the thin second section keeps the high impurity atom concentration. This means that each heterojunction bipolar transistor can not realize the high speed operation.

SUMMARY OF THE INVENTION

It is therefore an important object of the present invention to provide a bipolar transistor which has an improved collector region capable of reducing the collector transit time.

It is also an important object of the present invention to provide a bipolar transistor which is stable in operation.

It is also an important object of the present invention to provide a bipolar transistor which is free from a high temperature process used in the fabrication thereof.

To accomplish these objects, the present invention proposes to provide a first collector section and a second collector section having a smaller bandgap than the first collector section.

In accordance with the present invention, there is provided a bipolar transistor comprising: (a) an emitter region having a first conductivity type; (b) a base region having a second conductivity type opposite in polarity to the first conductivity type, an emitter-base junction being formed between the emitter region and the base region; and (c) a collector region having a first collector section formed of a first compound semiconductor material and a second collector section formed of a second compound semiconductor material of the first conductivity type, a base-collector junction being formed between the base region and the first collector section, an abrupt potential discontinuity being formed between the first collector section and the second collector section due to a difference in electron affinity between the first and second compound semiconductor materials, wherein the second semiconductor material is smaller in bandgap at the abrupt potential discontinuity than the first semiconductor material.

BRIEF DESCRIPTION OF THE DRAWINGS

The features and advantages of a bipolar transistor according to the present invention will be more clearly understood from the following description taken in conjunction with the accompanying drawings in which.

DESCRIPTION OF THE PREFERRED EMBODIMENTS

First Embodiment

Figure 5:
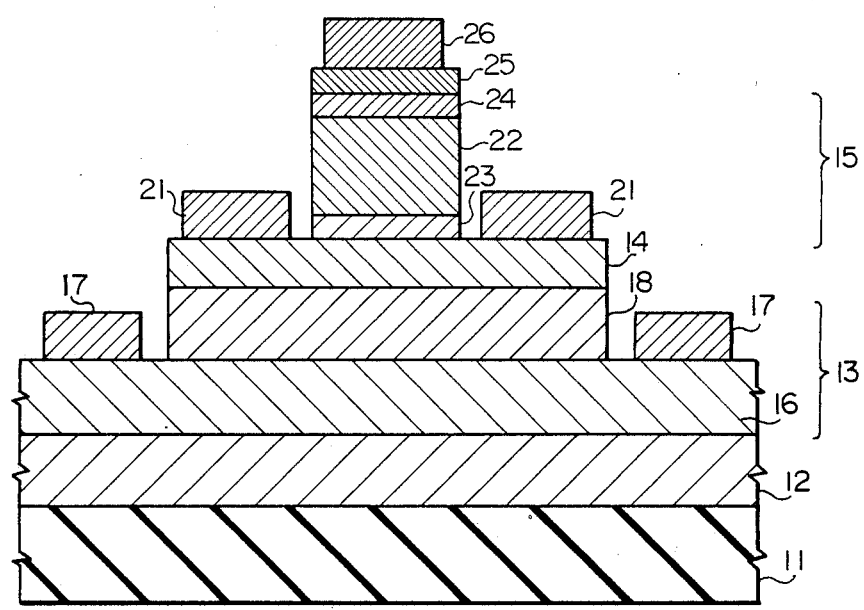
FIG. 5 is a cross sectional view showing the structure of a heterojunction bipolar transistor embodying the present invention.

Referring first to FIG. 5 of the drawings, there is shown the structure of a heterojunction bipolar transistor which is fabricated on a semi-insulating substrate 11 formed of an indium phosphide InP. The heterojunction bipolar transistor largely comprises a buffer layer 12, a collector region 13, a base region 14 and an emitter region 15 which are successively grown in lattice matched manner. The buffer layer 12 is formed of an intrinsic or non-doped indium aluminum arsenide represented by the molecular formula of InAlAs and has a thickness of about 300 nano-meters.

Figure 6:
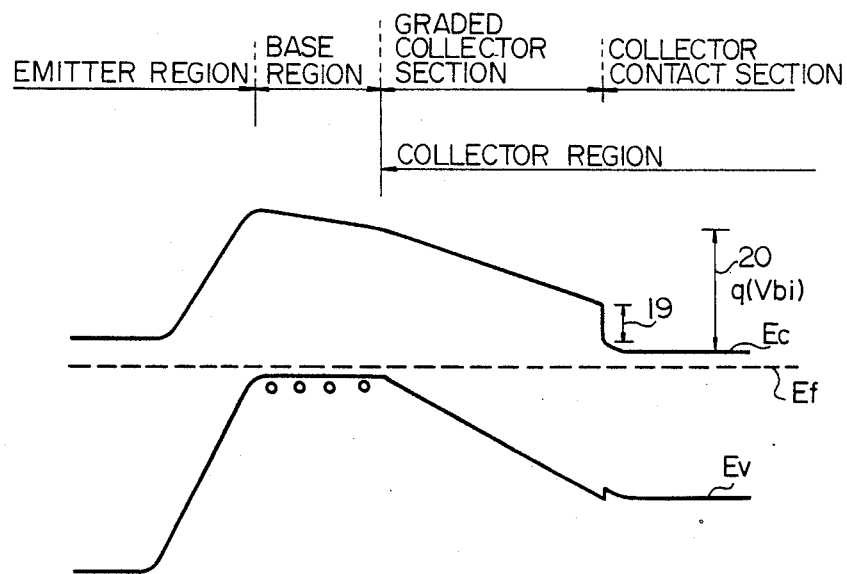
FIG. 6 is an energy band diagram showing an energy band representation of the heterojunction bipolar transistor illustrated in FIG. 5 in thermal equilibrium.

The collector region 13 has a collector contact section 16 contacting with a collector electrode 17 and a graded collector section 18 grown on the collector contact section 16, and the graded collector section 16 and the collector contact section 18 have thicknesses of about 500 nano-meters and about 150 nano-meters, respectively. The collector contact section 16 is formed of an n type indium gallium arsenide n+InGaAs doped with silicon atoms of about $1\times 10^{19} cm^{-3}$, and the graded collector section 18 is formed of an intrinsic or non-doped indium gallium aluminum arsenide represented by the molecular formula of $InGa_{1-x}Al_xAs$ where x is varied from 0.7 to 0.0 by spacing apart from the junction between the collector contact section 16 and the graded collector section 18. The graded collector section 18 is thus graded in composition ratio between the gallium atom and the aluminum atom, so that the graded collector section 18 is increased in bandgap from the base-collector junction toward the junction between the graded collector section 18 and the collector contact section 16 as illustrated in FIG. 6. Moreover, since the graded collector section 18 is different in bandgap from the collector contact section 16, an abrupt potential discontinuity 19 takes place at the junction between the collector contact section 16 and the graded collector section 18. The abrupt potential discontinuity 19 is equivalent to the difference in electron affinity between the two compound semiconductor materials used for the graded collector section 18 and the collector contact section, respectively. In FIG. 6, the upper edge of the valence band, the Fermi level and the lower edge of the conduction band are abbreviated as Ev, Ef and Ec, respectively. A potential difference 20 is produced between the collector region 13 and the base region 14, and the potential difference 20 is equivalent to the built-in potential qVbi between the collector region 13 and the base region 14.

Figure 7:
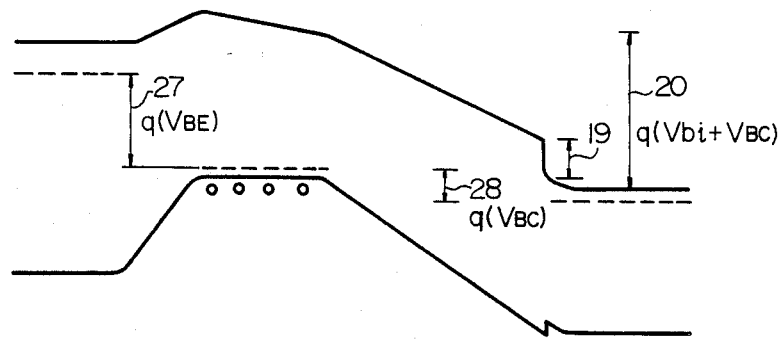
FIG. 7 is an energy band diagram showing an energy band representation of the heterojunction bipolar transistor illustrated in FIG. 5 in a biasing condition.

When biasing voltages are applied to the heterojunction bipolar transistor, the energy band representation is deformed as illustrated in FIG. 7. A difference 27 in potential takes place between the emitter region 15 and the base region 14 due to the base-emitter biasing voltage $V_{BE}$, and the base-collector biasing voltage $V_{BC}$ results in a difference 28 in potential. Then, the difference 20 in potential is increased in value from qVbi to q($Vbi+V_{BC}$), however the difference 20 in potential between the collector region 13 and the base region 14 is always compensated by the abrupt potential discontinuity 19, so that a relatively weak electric field takes place across the graded collector section 18, thereby being capable of restricting the production of hot electrons. As a result, the drift mobility is not decreased due to movement into the L-valley. The graded collector section 18 provides the relatively wide bandgap, so that a collector withstand voltage is relatively large. Moreover, the graded collector section 18 is increased in bandgap toward the junction between the graded collector section 18 and the collector contact section 16, so that holes are confined in the base region 14 and hardly reach the collector electrode 17. This results in enhancement in stability in operation. In addition, no heavily doped section is produced in the collector region 13, so that the characteristics of the heterojunction bipolar transistor is not affected by a heat treatment applied during the fabrication process.

Turning to FIG. 5, the base region 14 has a thickness of about 100 nano-meters and is formed of p type indium gallium aluminum arsenide represented by the molecular formula of $InGa_{1-x}Al_xAs$ where x is varied from 0.0 to 0.3 by spacing apart from the base-collector junction. The base region is heavily doped with beryllium atoms of about $2\times 10^{19} cm^{-3}$, and a base electrode 21 is formed on the base region 14. The emitter region 14 has an emitter section 22 sandwiched between two graded sections 23 and 34, and the emitter section 22, the graded sections 23 and 24 have thicknesses of about 200 nano-meters, about 50 nano-meters and about 50 nano-meters, respectively. The emitter section 22 is formed of an n type indium aluminum arsenide represented by the molecular formula of $In_{0.52}Al_{0.48}As$ and doped with silicon atoms of about $2\times 10^{17} cm^{-3}$. The graded section 23 is formed of an n type indium gallium aluminum arsenide represented by the molecular formula of $InGa_{1-x}Al_xAs$ where x is varied from 0.3 to 1.0 by spacing apart from the emitter-base junction, and the n type indium gallium arsenide is doped with silicon atoms of about $2\times 10^{17} cm^{-3}$. On the other hand, the graded section 24 is formed of an n type indium gallium aluminum arsenide represented by the molecular formula of $InGa_{1-x}Al_xAs$ where x is varied from 1.0 to 0.0 by spacing apart from the junction between the emitter section 22 and the graded section 24, and the indium gallium aluminum arsenide is doped with silicon atoms of about $1\times 10^{19} cm^{-3}$. The graded section 24 is overlain by an emitter cap layer 25 which is formed of an n type indium gallium arsenide doped with silicon atoms of about $1\times 10^{19} cm^{-3}$, and the emitter cap layer 25 has a thickness of about 50 nano-meters. An emitter electrode 26 is provided on the emitter cap layer 25.

Second Embodiment

Figure 8:
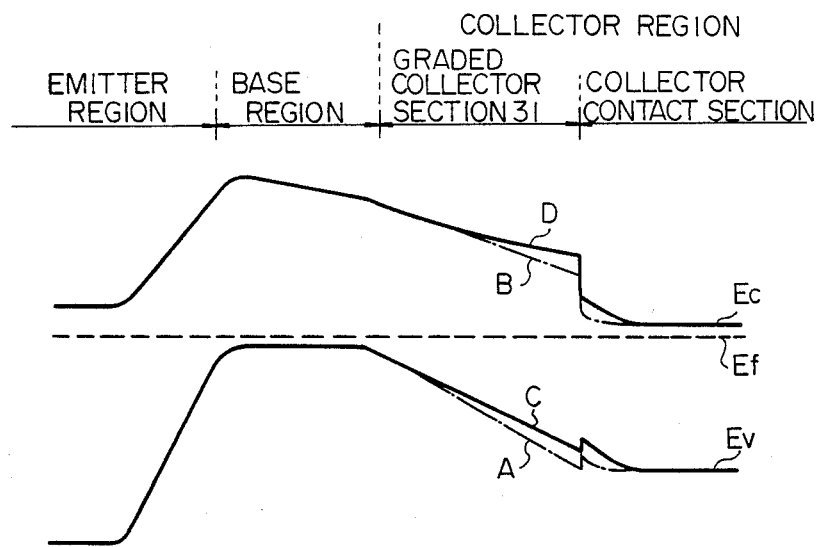
FIG. 8 is an energy band diagram showing an energy band representation of a heterojunction bipolar transistor in thermal equilibrium.

Turning to FIG. 8 of the drawings, there is shown an energy band representation formed in another heterojunction bipolar transistor embodying the present invention. The heterojunction bipolar transistor is similar to that illustrated in FIG. 5 except for a graded collector section 31, so that description will be focused upon the graded collector region 31. The graded collector section 31 is lightly doped with p type impurity atoms, typically beryllium atoms, so as to perfectly deplete the graded collector section 31, and the upper edge Ev of the valence band and the lower edge Ec of the conduction band are shifted from dot-and-dash lines A and B to real lines C and D, respectively. The graded collector section 31 is thus perfectly depleted by doping the p type impurity atoms, so that space charges produced in the graded collector section 31 allows the electrons to increase the potentials thereof, thereby preventing each electron from abrupt lose of potential energy during travel across the collector depletion layer encountered in the prior-art heterojunction bipolar transistor. Although the graded collector section 31 is doped with p type impurity atoms similar to the base region, the graded collector section 31 forms part of the collector region, because the graded collector section 31 is perfectly depleted to serve as the collector depletion layer.

Third Embodiment

Figure 9:
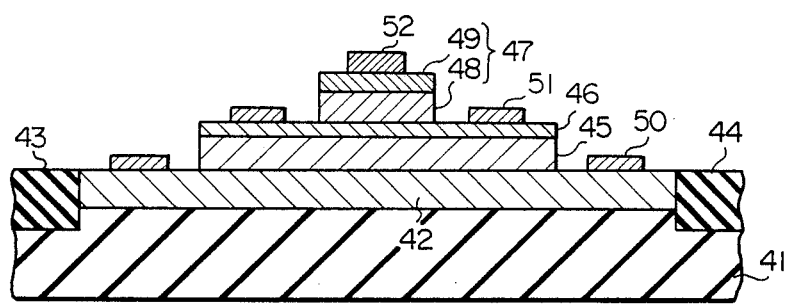
FIG. 9 is a cross sectional view showing the structure of still another heterojunction bipolar transistor embodying the present invention.

Turning to FIG. 9 of the drawings, the structure of still another heterojunction bipolar transistor is illustrated and fabricated on a semi-insulating substrate 41. On the semi-insulating substrate 41 is grown a high impurity atom concentration layer 42 of an n+type gallium arsenide which is about 2000 angstroms in thickness and doped with silicon atoms of about $5\times 10^{18} cm^{-3}$ by using a molecular beam epitaxy process. Isolation regions 43 and 44 are formed by implantation of protons and penetrate into the semi-insulating substrate 41 to define a transistor forming area. On the high impurity atom concentration layer 42 are successively grown an emitter layer 45, a base layer 46, a multi-layer collector 47 by using the molecular beam epitaxy process. In this instance, the emitter layer has a thickness of about 2000 angstroms and is formed of an n type aluminum gallium arsenide $Al_{0.25}Ga_{0.75}As$ doped with silicon atoms of about $3\times10^{18} cm^{-3}$. The base layer 46 is about 1000 angstroms in thickness and formed of a p type gallium arsenide p+GaAs doped with beryllium atoms of about $2\times10^{19} cm^{-3}$. The multi-layer collector 47 is provided with a first collector section 48 of about 2000 angstroms in thickness and a second collector section 49 of about 700 angstroms in thickness. The first collector section 48 is formed of an intrinsic or non-doped gallium arsenide GaAs, and the second collector section 49 is formed of an n type indium arsenide (InAs) doped with silicon atoms of about $5\times10^{18} cm^{-3}$. These layers and sections are etched and patterned as illustrated in FIG. 9 by using lithographic techniques, and an emitter electrode 50, a base electrode 51 and a collector electrode 52 are formed on the emitter layer 42, the base layer 46 and the second collector section 49, respectively.

Figure 1:
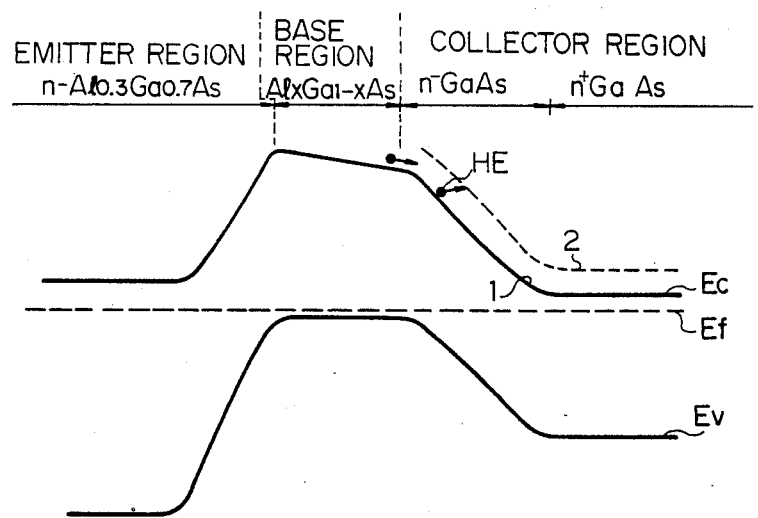
FIG. 1 is an energy band diagram showing an energy band representation of a prior-art heterojunction bipolar transistor.
Figure 2:
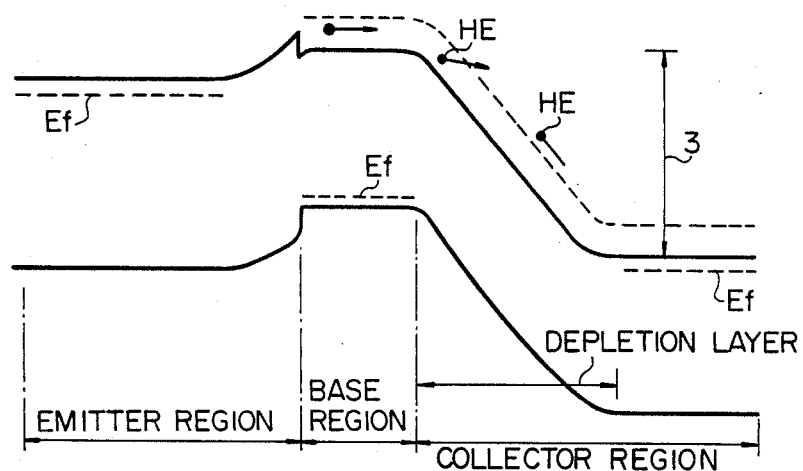
FIG. 2 is an energy band diagram showing an energy band representation of another prior-art heterojunction bipolar transistor.
Figure 3:
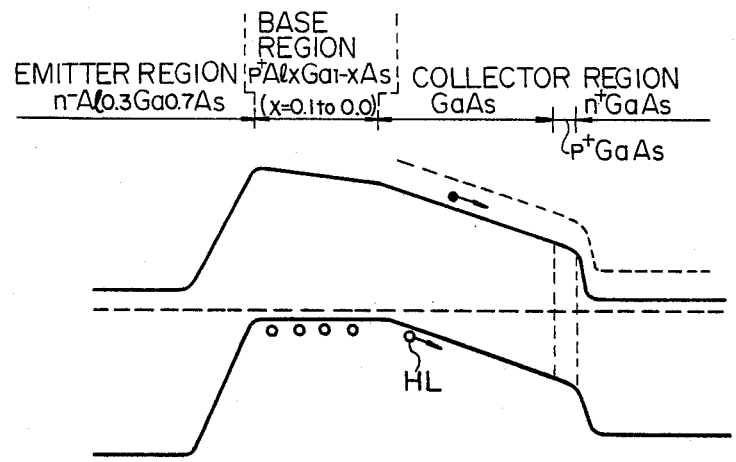
FIG. 3 is an energy band diagram showing an energy band representation of still another prior-art heterojunction bipolar transistor of the type having a p-n junction formed of heavily doped impurity sections in the collector region thereof.
Figure 4:
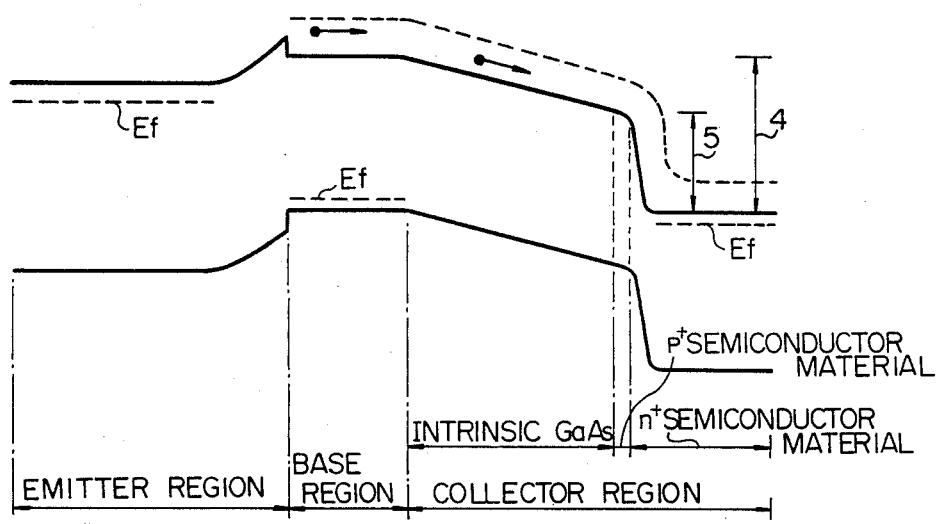
FIG. 4 is an energy band diagram showing an energy band representation of still another prior-art heterojunction bipolar transistor of the type having a p-n junction formed of heavily doped impurity sections in the collector region thereof.
Figure 10:
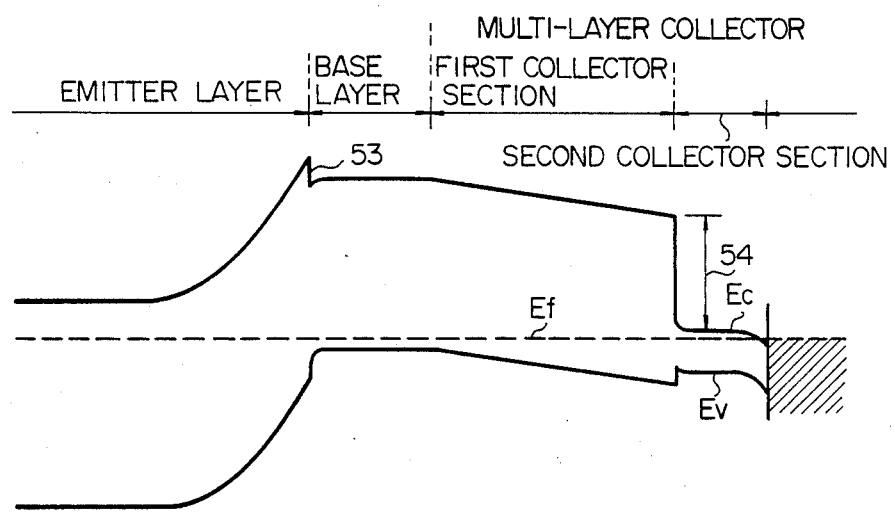
FIG. 10 is an energy band diagram showing an energy band representation of the heterojunction bipolar transistor of FIG. 9 in thermal equilibrium.
Figure 11:
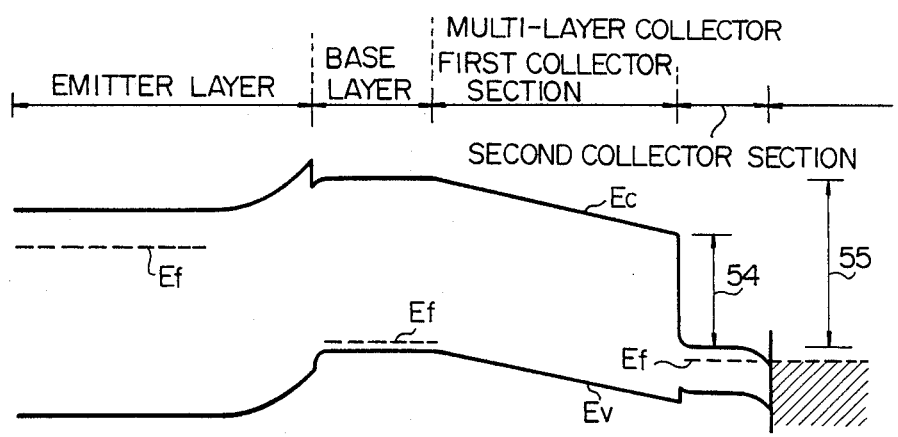
FIG. 11 is an energy band diagram showing an energy band representation of the heterojunction bipolar transistor of FIG. 9 in a biasing condition.

The heterojunction bipolar transistor thus formed has an energy band representation shown in FIG. 10 in thermal equilibrium. As will be seen from FIG. 10, a heterojunction 53 is formed between the emitter layer 45 and the base layer 46, and an abrupt potential discontinuity 54 takes place between the first and second collector sections 48 and 49. The abrupt potential discontinuity is produced due to a difference in electron affinity between the non-doped gallium arsenide and the n type indium arsenide. When a forward biasing voltage and a reverse biasing voltage are applied between the emitter layer 45 and the base layer 46 and between the base layer and the multilevel collector 47, respectively, the energy band representation is deformed as illustrated in FIG. 11. In this biasing condition, a potential difference 55 takes place and is equivalent to the total amount of the built-in potential between the base layer 46 and the multi-level collector 47 and the reverse biasing voltage. However, the potential difference 55 is always compensated by the abrupt potential discontinuity, so that the electric field applied across the first collector section is decreased in value, thereby restricting the production of the hot electrons. This results in improvement in operation speed of the heterojunction bipolar transistor. The heterojunction bipolar transistor shown in FIG. 9 uses the compound semiconductor materials different in electron affinity to form the first and second collector sections 48 and 49, so that the abrupt potential discontinuity 54 is hardly broken down in comparison with the potential difference formed by the p-n junction of the prior-art heterojunction bipolar transistor illustrated in FIG. 3 or 4. Moreover, no heavily doped region is used to form the abrupt potential discontinuity 54, so that a heat treatment does not affect the abrupt potential discontinuity 54. This results in improvement in stability.

Fourth Embodiment

Figure 12:
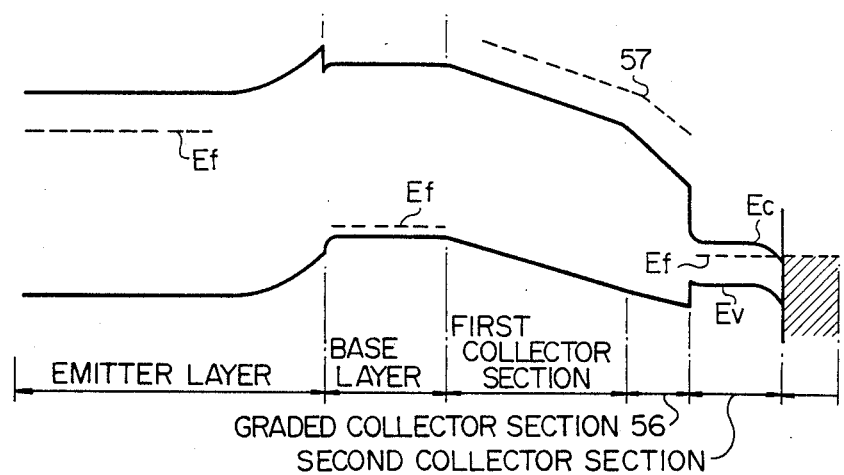
FIG. 12 is an energy band diagram showing an energy band representation of a heterojunction bipolar transistor embodying the present invention.

Turning to FIG. 12 of the drawings, there is shown an energy band representation of another heterojunction bipolar transistor embodying the present invention. The heterojunction bipolar transistor is characterized by a graded collector section 56, however another layers and sections are similar to those of the heterojunction bipolar transistor shown in FIG. 9. Then, description will be focused upon the graded collector section 56. The graded collector section 56 intervenes between the first and second collector sections 48 and 49, and the molecular beam epitaxy process is used to grow the graded collector section 56. The graded collector section 56 is formed of a non-doped indium gallium arsenide represented by the molecular formula of $In_xGa_{1-x}As$ where x is varied from 0.0 to 0.4 by spacing apart from the first collector section 48.

By virtue of the graded collector section 56, potential difference between the L-valley 57 and the Γ-valley is increased in the multi-level collector, so that transition of the hot electrons is restricted. Moreover, the graded collector section 56 is desirable to reduce a lattice distortion due to the difference in lattice constant between the gallium arsenide and the indium arsenide. In this instance, the first collector section is formed of an intrinsic compound semiconductor material, however a lightly doped p type compound semiconductor material is available in so far as the first collector section is depleted.

Fifth Embodiment

Figure 13:
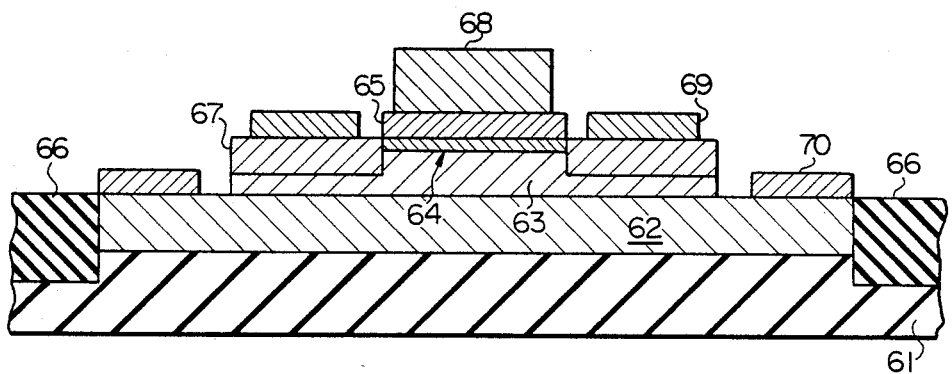
FIG. 13 is a cross sectional view showing the structure of a heterojunction bipolar transistor embodying the present invention.

Turning to FIG. 13 of the drawings there is shown the structure of a heterojunction bipolar transistor which is fabricated on a semi-insulating substrate 61 of a gallium arsenide. On the semi-insulating substrate 61 are epitaxially grown a multi-layer structure which comprises a heavily doped n type emitter contact layer 62 formed of gallium arsenide and having a thickness of about 5000 angstroms for provided an ohmic contact, an n type emitter layer 63 formed of aluminum gallium arsenide represented by the molecular formula of $Al_{0.25}Ga_{0.75}As$ and having a thickness of about 3000 angstroms, a graded base layer 64 having a thickness of about 1000 angstroms and formed of a p type aluminum gallium arsenide represented by the molecular formula of $AlGa_{1-x}As$ where x is varied from 0.0 to 0.1 by spacing apart from the emitter layer 63, and a collector layer 65 formed of a non-doped gallium arsenide and having a thickness of about 2000 angstroms. A molecular beam epitaxy may be used for formation of the multi-layer structure.

After formation of the multi-layer structure, the base layer 64 and the emitter contact layer 62 are exposed by using appropriate etching techniques and a transistor forming area is defined by an isolating region 66 formed by implantation of protons. Magnesium atoms are implanted into the peripheral region 67 of the base layer 64 for preventing the heterojunction bipolar transistor from deterioration in current gain due to a leakage current from the emitter layer 63 to the peripheral region 67 of the base layer 64. Subsequently, a collector electrode 68 of tungsten silicide, a base electrode 69 of an aurum-manganese alloy and an emitter electrode 70 of an aurumgermanium/nickel/ aurum alloy are formed on the collector layer 65, the peripheral region 67 of the base layer 65 and the emitter contact layer 62, respectively. In this instance, the collector electrode 68, the base electrode 69 and the emitter electrode 70 have respective thicknesses of about 5000 angstroms, about 2000 angstroms and about 2000 angstroms.

Figure 14:
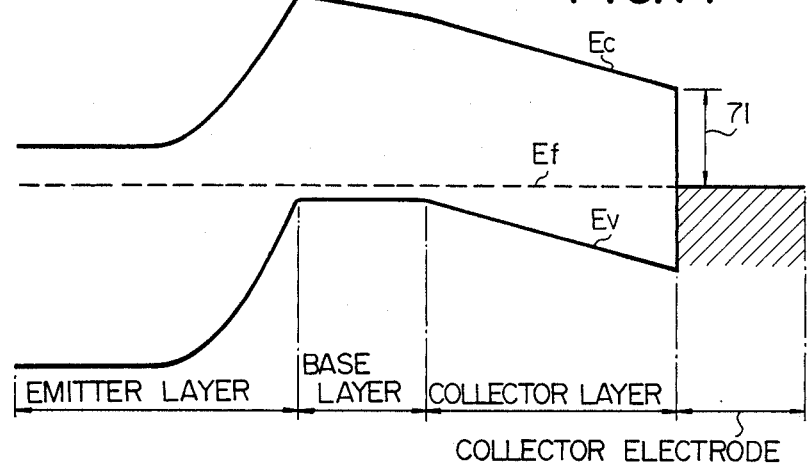
FIG. 14 is an energy band diagram showing an energy band representation of the heterojunction bipolar transistor shown in FIG. 13 in thermal equilibrium.
Figure 15:
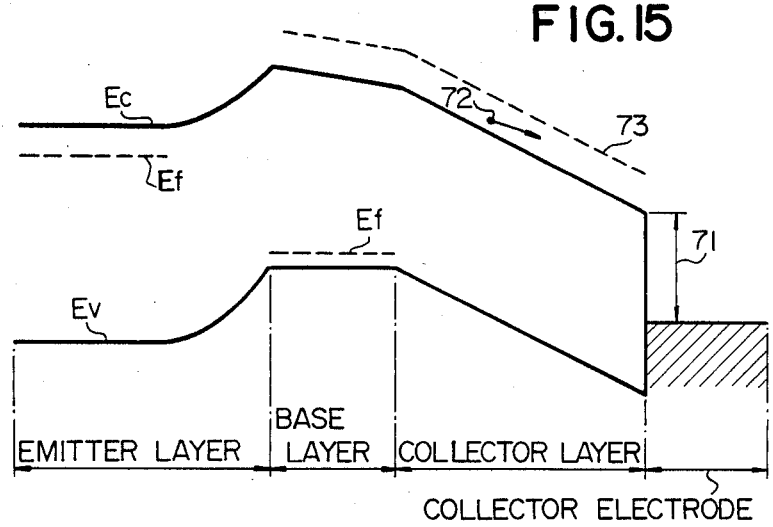
FIG. 15 is an energy band diagram showing an energy band representation of the heterojunction bipolar transistor shown in FIG. 13 in a biasing condition.

An energy band representation of the heterojunction bipolar transistor in thermal equilibrium is shown in FIG. 14. In FIG. 14, the upper edge of the valence band, the Fermi level and the lower edge of the conduction band are abbreviated as Ev, Ef and Ec, respectively. As will be seen from FIG. 14, a Schottky barrier 71 is produced between the collector layer 65 and the collector electrode 68, and no impurity atoms are doped into the collector region 65. Then, deformation of the edges is negligible and an electric field is uniformly applied across the collector layer 65. When the heterojunction bipolar transistor is shifted from the thermal equilibrium to a biasing condition shown in FIG. 15, electrons 72 can travel at a high speed over the collector layer 65 without transition to the L-valley 73.

Sixth Embodiment

Figure 16:
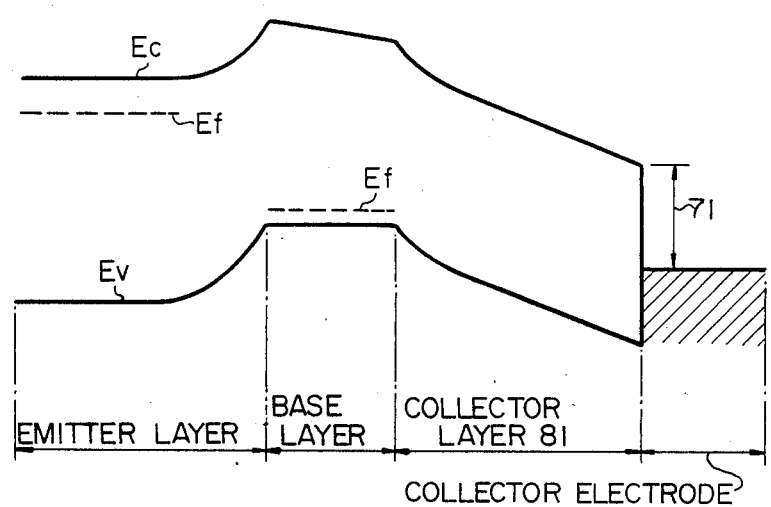
FIG. 16 is an energy band diagram showing an energy band representation of a heterojunction bipolar transistor embodying the present invention.

Turning to FIG. 16 of the drawings, there is shown an energy band representation of another heterojunction bipolar transistor in a biasing condition. The upper edge of the valence band, the Fermi level and the lower edge of the conduction band are respectively abbreviated as Ev, Ef and Ec as similar to the representation shown in FIGS. 14 and 15. The heterojunction bipolar transistor is similar in structure to that shown in FIG. 13 except for a collector layer 81 corresponding to the collector layer 65. The collector layer 81 is formed of a gallium arsenide lightly doped with n type impurity atoms so as to perfectly deplete mobile charges in the thermal equilibrium. Namely, the collector impurity atom concentration $N_D$ is selected to satisfy the following equation.

$$Wc \leq \sqrt{\frac{2\varepsilon s}{q}\left(\frac{N_A + N_D}{N_A N_D}\right)V_{bi}}$$

where Wc is the thickness of the collector layer, $N_A$ is the base impurity atom concentration, $\varepsilon s$ is the semiconductor permittivity, q is the magnitude of the electric charge, and Vbi is the built-in potential between the base layer and the collector layer. In this instance, the collector layer 81 is doped with the n type impurity atoms of about $1 \times 10^{16} cm^{-3}$.

In the collector layer 65 of the fifth embodiment, the collector current density is saturated to a certain value due to the fixed charges, however the collector current density is increased in the collector layer 81 in the presence of impurity ions opposite in polarity to the electrons. Although the conduction band is slightly deformed due to the distribution of the ions and, accordingly, the electric field is not uniform, the affection is negligible because of the small potential difference in the collector layer 81.

Seventh Embodiment

Figure 17:
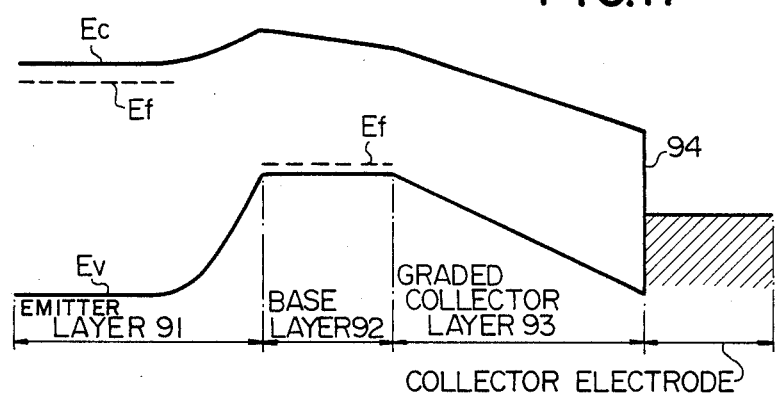
FIG. 17 is an energy band diagram showing an energy band representation of a heterojunction bipolar transistor embodying the present invention.

Turning to FIG. 17 of the drawings, there is shown an energy band representation of still another heterojunction bipolar transistor embodying the present invention. The heterojunction bipolar transistor illustrated in FIG. 17 is fabricated on an indium phosphide substrate and comprises an emitter layer 91 formed of an n type indium aluminum arsenide, a base layer 92 formed of a heavily doped p type indium aluminum gallium arsenide represented by the molecular formula of $InAl_xGa_{1-x}As$, a graded collector layer 93 formed of a non-doped indium aluminum gallium arsenide represented by the molecular formula of $InAl_yGa_{1-y}As$ where y is varied from 0.0 to 0.7 by spacing apart from the basecollector junction, and a collector electrode. A Schottky barrier 94 is formed between the graded collector layer 93 and the collector electrode as similar to the heterojunction bipolar transistor illustrated in FIG. 13. The heterojunction bipolar transistor has the graded collector layer 93 with an energy bandgap increased toward the collector electrode, so that electrons traveling over the collector layer 93 is less decreased in potential. In this instance, the indium aluminum gallium arsenide is lattice matched to the indium phosphide substrate. If the aluminum atoms are increased in the indium aluminum gallium arsenide, a difference between the lower edge Ec of the conduction band and the L-valley is rapidly decreased, so that the electrons in the graded collector layer 93 are liable to transit to the L-valley. Then, the graded collector layer 93 is formed of the indium aluminum gallium arsenide $InAl_xGa_{1-x}As$ which has a large difference in potential between the lower edge Ec of the conduction band and the L-valley in comparison with an aluminum gallium arsenide represented by the molecular formula of $Al_xGa_{1-x}As$.

Eighth Embodiment

Figure 18:
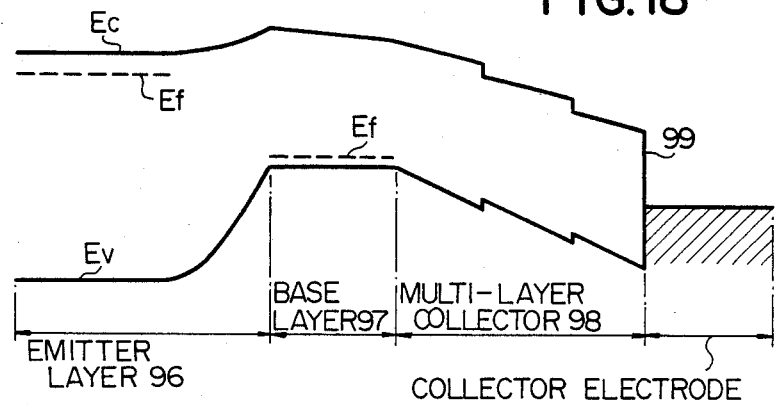
FIG. 18 is an energy band diagram showing an energy band representation of a heterojunction bipolar transistor embodying the present invention.

Turning to FIG. 18 of the drawings, there is shown an energy band representation of still another heterojunction bipolar transistor embodying the present invention. The heterojunction bipolar transistor illustrated in FIG. 18 is fabricated on an indium phosphide substrate and comprises an emitter layer 96 formed of an n type indium aluminum arsenide, a base layer 97 formed of a heavily doped p type indium aluminum gallium arsenide represented by the molecular formula of $InAl_xGa_{1-x}As$, a multi-layer collector 98 formed of a non-doped indium aluminum gallium arsenide represented by the molecular formula of $InAl_yGa_{1-y}As$ where y is varied from 0.0 to 0.8 by spacing apart from the base-collector junction, and a collector electrode. A Schottky barrier 99 is formed between the graded collector layer 93 and the collector electrode as similar to the heterojunction bipolar transistor illustrated in FIG. 13. The heterojunction bipolar transistor has the graded collector layer 93 with an energy bandgap stepwise increased toward the collector electrode, so that electrons traveling over the collector layer 93 is less decreased in potential. Moreover, the multi-layer collector has a stepped configuration, so that it is relatively easy to form the gallium-rich section ($InAl_{0.2}Ga_{0.8}As$).

In this instance, the collector electrode is formed of a heat-resistant tungsten silicide, however another metal capable of forming a Schottky barrier is available, so that titanium, aurum or platinum may be used to form the collector electrode.

Although particular embodiment of the present invention have been shown and described, it will be obvious to those skilled in the art that various changes and modifications may be made without departing from the spirit and scope of the present invention. For example, the present invention is applicable to a heterojunction bipolar transistor formed of lattice-mismatched semiconductor materials and a bipolar transistor without heterojunction between the base and emitter regions. In the embodiments described above, each of the base regions is graded in bandgap, however another implementation may have a base region which is uniform in bandgap. Various compound semiconductor materials may be used in another implementation.

What is claimed is:
1. A bipolar transistor comprising:
   (a) an emitter region having a first conductivity type;
   (b) a base region having a second conductivity type opposite in polarity to said first conductivity type, an emitter-base junction formed between said emitter region and said base region; and

(c) a collector region having a first collector section formed of a first compound semiconductor material and a second collector section formed of a second semiconductor material of said first conductivity type, a base-collector region formed between said base region and said first collector section, an abrupt potential discontinuity formed between said first collector section and said second collector section due to a difference in electron affinity between said first and second compound semiconductor materials, wherein said second semiconductor material is smaller than said first semiconductor material in a bandgap at said abrupt potential discontinuity, said first and second collector section being formed of a non-doped gallium arsenide and an n type indium arsenide, respectively.

2. A bipolar transistor as set forth in claim 1, in which said second collector section is doped with silicon atoms of about $5 \times 10^{18} cm^{-3}$.

3. A bipolar transistor as set forth in claim 2, in which said first and second collector sections have respective thicknesses of about 2000 angstroms and about 700 angstroms, respectively.

4. A bipolar transistor as set forth in claim 3, in which a heterojunction is formed between said emitter region and said base region.

5. A bipolar transistor as set forth in claim 4, in which said emitter region and said base region are formed of an n type aluminum gallium arsenide represented by the molecular formula of $Al_{0.25}Ga_{0.75}As$ and a p type gallium arsenide, respectively.

6. A bipolar transistor as set forth in claim 5, in which said emitter region and said base region are doped with silicon atoms of about $3 \times 10^{18} cm^{-3}$ and beryllium atoms of about $2 \times 10^{19} cm^{-3}$, respectively.

7. A bipolar transistor as set forth in claim 6, in which said emitter region and said base region have respective thicknesses of about 2000 angstroms and about 1000 angstroms, respectively.

8. A bipolar transistor as set forth in claim 5, in which said bipolar transistor further comprises a graded collector section intervening between said first and second collector sections and formed of a non-doped indium gallium arsenide represented by the molecular formula of $In_xGa_{1-x}As$ where x is varied from 0.0 to 0.4 by spacing apart from said first collector section.

9. A bipolar transistor as set forth in claim 1, in which said first collector section is formed of a gallium arsenide lightly doped with p type impurity atoms so as to deplete mobile charges therein.

10. A bipolar transistor as set forth in claim 1, in which said first collector section is formed of a non-doped indium gallium aluminum arsenide represented by the molecular formula of $InGa_{1-x}Al_xAs$ where x is varied from 0.7 to 0.0 by spacing apart from said abrupt potential discontinuity.

11. A bipolar transistor as set forth in claim 10, in which said second collector section is formed of an n type indium gallium arsenide.

12. A bipolar transistor as set forth in claim 11, in which said second semiconductor material is doped with silicon atoms of about $1 \times 10^{19} cm^{-3}$.

13. A bipolar transistor as set forth in claim 12, in which said first and second collection section have respective thicknesses of about 1500 angstroms and about 5000 angstroms.

14. A bipolar transistor as set forth in claim 13, in which said base region is formed of a p type indium gallium aluminum arsenide represented by the molecular formula of $InGa_{1-x}Al_xAs$ where x is varied from 0.0 to 0.3 by spacing apart from said base-collector junction.

15. A bipolar transistor as set forth in claim 14, in which said base region is doped with beryllium atoms of about $2 \times 10^{19} cm^{-3}$.

16. A bipolar transistor as set forth in claim 15, in which said base region has a thickness of about 1000 angstroms.

17. A bipolar transistor as set forth in claim 16, in which said emitter region has a first emitter section forming said emitter-base junction together with said base region, said first emitter section being formed of an n type indium gallium aluminum arsenide represented by the molecular formula of $InGa_{1-x}Al_xAs$ where x is varied from 0.3 to 1.0 by spacing apart from said emitter-base junction.

18. A bipolar transistor as set forth in claim 17, in which said emitter region further has a second emitter section which is contiguous to said first emitter section, said second emitter section being formed of an n type indium aluminum arsenide represented by the molecular formula of $In_{0.52}Al_{0.48}As$.

19. A bipolar transistor as set forth in claim 18, in which said emitter region further has a third emitter section contiguous to said second emitter section, said third emitter section being formed of an n type indium gallium aluminum arsenide represented by the molecular formula of $InGa_{1-x}Al_xAs$ where x is varied from 1.0 to 0.0 by spacing apart from said second emitter section.

20. A bipolar transistor as set forth in claim 19, in which said first, second and third emitter sections are doped with silicon atoms of about $2 \times 10^{17} cm^{-3}$, about $2 \times 10^{17} cm^{-3}$ and about $1 \times 10^{19} cm^{-3}$, respectively.

21. A bipolar transistor as set forth in claim 20, in which said first, second and third emitter sections have respective thicknesses of about 500 angstroms, about 2000 angstroms and about 500 angstroms.

22. A bipolar transistor as set forth in claim 21, in which said bipolar transistor further comprises a buffer layer intervening between a semi-insulating substrate and said second collector section, said buffer layer being formed of a non-doped indium aluminum arsenide and having a thickness of about 3000 angstroms.

23. A bipolar transistor as set forth in claim 22, in which said bipolar transistor further comprises an emitter cap layer contiguous to said third emitter section, said emitter section being formed of an n type indium gallium arsenide represented by the molecular formula of $In_{0.53}Ga_{0.47}As$ doped with silicon atoms of about $1 \times 10^{19} cm^{-3}$, said emitter cap layer having a thickness of about 500 angstroms.

24. A heterojunction bipolar transistor fabricated on a semi-insulating substrate, comprising:
 (a) an n type gallium arsenide layer epitaxially grown on said semi-insulating substrate and doped with silicon atoms of about $5 \times 10^{18} cm^{-3}$, said n type gallium arsenide layer having a thickness of about 2000 angstroms;
 (b) an emitter region epitaxially grown on said n type gallium arsenide layer and formed of an n type aluminum gallium arsenide represented by the molecular formula of $Al_{0.25}Ga_{0.75}As$ doped with silicon atoms of about $3 \times 10^{18} cm^{-3}$, said emitter region having a thickness of about 2000 angstroms;

(c) a base region epitaxially grown on said emitter region and formed of a p type gallium arsenide doped with beryllium atoms of about $2 \times 10^{19} cm^{-3}$, said base region having a thickness of about 1000 angstroms, an emitter-base junction being formed between said emitter region and said base region;

(d) a collector region having a first collector section epitaxially grown on said base region and a second collector section epitaxially grown on the first collector section, a basecollector junction being formed between said base region and said first collector section; and (e) an emitter electrode, a base electrode and a collector electrode respectively formed on said n type gallium arsenide layer, said base region and said second collector section, wherein said first and second collector sections are formed of a non-doped gallium arsenide and an n type indium arsenide doped with silicon atoms of about $5 \times 10^{18} cm^{-3}$, respectively, said first and second collector sections having respective thicknesses of about 2000 angstroms and about 700 angstroms.

25. A heterojunction bipolar transistor fabricated on a semi-insulating substrate of an indium phosphide, comprising:

(a) a buffer layer epitaxially grown on said semi-insulating substrate and formed of a non-doped indium aluminum arsenide, said buffer layer having a thickness of about 3000 angstroms;

(b) a collector contact layer epitaxially grown on said buffer layer and formed of an n type indium gallium arsenide doped with silicon atoms of about $1 \times 10^{19} cm^{-3}$, said collector contact layer having a thickness of about 5000 angstroms;

(c) a graded collector layer epitaxially grown on said collector contact layer and formed of a non-doped indium gallium aluminum arsenide represented by the molecular formula of $InGa_{1-x}Al_xAs$ where x is varied from 0.7 to 0.0 by spacing apart from said collector contact layer, said graded collector layer having a thickness of about 1500 angstroms;

(d) a base layer epitaxially grown on said graded collector layer and formed of a p type indium gallium aluminum arsenide doped with beryllium atoms of about $2 \times 10^{19} cm^{-3}$ represented by the molecular formula of $InGa_{1-x}Al_xAs$ where x is varied from 0.0 to 0.3 by spacing apart from said graded collector layer, said base layer having a thickness of about 1000 angstroms;

(e) a first emitter layer epitaxially grown on said base layer and formed of an n type indium gallium aluminum arsenide represented by the molecular formula of $InGa_{1-x}Al_xAs$ where x is varied from 0.3 to 1.0 by spacing apart from said base layer, said first emitter layer being doped with silicon atoms of about $2 \times 10^{17} cm^{-3}$ and having a thickness of about 500 angstroms;

(f) a second emitter layer epitaxially grown on said first emitter layer and formed of an n type indium aluminum arsenide represented by the molecular formula of $In_{0.52}Al_{0.48}As$ doped with silicon atoms of about $2 \times 10^{17} cm^{-3}$, said second emitter layer having a thickness of about 2000 angstroms;

(g) a third emitter layer epitaxially grown on said second emitter layer and formed of an n type indium gallium aluminum arsenide represented by the molecular formula of $InGa_{1-x}Al_xAs$ where x is varied from 1.0 to 0.0 by spacing apart from said second emitter layer, said third emitter layer being doped with silicon atoms of about $1 \times 10^{19} cm^{-3}$ and having a thickness of about 500 angstroms;

(h) an emitter cap layer epitaxially grown on said third emitter layer and formed of an n type indium gallium arsenide represented by the molecular formula of $In_{0.53}Ga_{0.47}As$ doped with silicon atoms of about $1 \times 10^{19} cm^{-3}$, said emitter cap layer having a thickness of about 500 angstroms; and (i) a collector electrode, a base electrode and an emitter electrode formed on said collector contact layer, said base layer and said emitter cap layer, respectively.

26. A bipolar transistor comprising:

(a) an emitter region having a first conductivity type;

(b) a base region having a second conductivity type opposite in polarity to said first conductivity type, an emitter-base junction formed between said emitter region and said base region; and (c) a collector region having a first collector section formed of a first compound semiconductor material and a second collector section formed of a second compound semiconductor material of said first conductivity type, a base-collector junction formed between said base region and said first collector section, an abrupt potential discontinuity formed between said first collector section and said second collector section due to a difference in electron affinity between said first and second compound semiconductor materials, wherein said second semiconductor material is smaller than said first semiconductor material in a bandgap at said abrupt potential discontinuity, said first compound semiconductor material having an energy band representation increased in bandgap from said base-collector junction to said abrupt potential discontinuity.

27. A bipolar transistor comprising:

(a) an emitter region having a first conductivity type;

(b) a base region having a second conductivity type opposite in polarity to said first conductivity type, an emitter-base junction formed between said emitter region and said base region; and (c) a collector region having a first collector section formed of a first compound semiconductor material and a second collector section formed of a second compound semiconductor material of said first conductivity type, a base-collector junction formed between said base region and said first collector section, an abrupt potential discontinuity formed between said first collector section and said second collector section due to a difference in electron affinity between said first and second compound semiconductor materials, wherein said second semiconductor material is smaller than said first semiconductor material in a bandgap at said abrupt potential discontinuity, said first compound semiconductor material having an energy band representation increased in bandgap from said base-collector junction to said abrupt potential discontinuity, and said collector region is in contact with a collector electrode so that a Schottky barrier takes places therebetween.

28. A heterojunction bipolar transistor fabricated on an indium phosphate substrate, said transistor comprising (a) an emitter layer formed of an n type indium aluminum arsenide,
(b) a base layer formed of a heavily doped p type indium aluminum gallium arsenide,
(c) a graded collector layer formed of a non-doped indium aluminum gallium arsenide represented by the molecular formula of $InAl_yGa_{1-y}As$, where y is varied from 0.0 to 0.7 by spacing apart from a base collector junction, said non-doped indium aluminum gallium arsenide being lattice matched with said indium phosphide substrate, and
(d) a collector electrode formed on said graded collector layer, in which a Schottky barrier takes place therebetween and in which said graded collector layer has an energy band representation increased in bandgap toward said collector electrode.

* * * * *